United States Patent
Ryu et al.

(10) Patent No.: US 10,629,262 B2
(45) Date of Patent: Apr. 21, 2020

(54) METHOD OF OPERATING RESISTIVE MEMORY DEVICE CAPABLE OF REDUCING WRITE LATENCY

(71) Applicant: SAMSUNG ELECTRONICS CO., LTD., Suwon-si, Gyeonggi-Do (KR)

(72) Inventors: Hye-Young Ryu, Seoul (KR); Kyung-Chang Ryoo, Seongnam-si (KR); Yong-Jun Lee, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/116,141

(22) Filed: Aug. 29, 2018

(65) Prior Publication Data

US 2019/0267084 A1 Aug. 29, 2019

(30) Foreign Application Priority Data

Feb. 27, 2018 (KR) ......................... 10-2018-0023899

(51) Int. Cl.
*G11C 13/00* (2006.01)
*G11C 11/56* (2006.01)

(52) U.S. Cl.
CPC ...... *G11C 13/0069* (2013.01); *G11C 11/5678* (2013.01); *G11C 13/0004* (2013.01); *G11C 13/004* (2013.01); *G11C 13/0028* (2013.01)

(58) Field of Classification Search
None
See application file for complete search history.

(56) References Cited

U.S. PATENT DOCUMENTS

| | | | |
|---|---|---|---|
| 6,545,907 B1 | 4/2003 | Lowrey et al. | |
| 7,813,178 B2 | 10/2010 | Nakai | |
| 7,957,209 B2 | 6/2011 | Ruckerbauer | |
| 8,184,487 B2 | 5/2012 | Mirichigni et al. | |
| 8,976,610 B2 | 3/2015 | Andre et al. | |
| 9,208,835 B2 | 12/2015 | Ferrario et al. | |
| 9,859,003 B1* | 1/2018 | Das | G11C 13/0007 |
| 2008/0219047 A1* | 9/2008 | Yu | G11C 7/1006 365/163 |
| 2008/0320210 A1* | 12/2008 | Kim | G06F 12/0238 711/103 |

(Continued)

FOREIGN PATENT DOCUMENTS

CN 102831929 A * 12/2012

OTHER PUBLICATIONS

A machine translation of CN-102831929-A (corresponding to the citation "N" above) (Year: 2012).*

*Primary Examiner* — J. H. Hur
(74) *Attorney, Agent, or Firm* — F. Chau & Associates, LLC

(57) ABSTRACT

Provided is a method of operating a resistive memory device including a memory cell array. The method includes the resistive memory device performing a first write operation in response to an active command and a write command and performing a second write operation in response to a write active command and the write command. The first write operation includes a read data evaluation operation for latching data read from the memory cell array in response to the active command. The second write operation excludes the read data evaluation operation.

20 Claims, 10 Drawing Sheets

(56) References Cited

U.S. PATENT DOCUMENTS

| | | | |
|---|---|---|---|
| 2009/0043973 A1* | 2/2009 | Kang | G11C 13/0004 |
| | | | 711/154 |
| 2009/0285008 A1* | 11/2009 | Jeong | G11C 8/10 |
| | | | 365/148 |
| 2010/0085804 A1* | 4/2010 | Katagiri | G11C 7/08 |
| | | | 365/163 |
| 2015/0049570 A1 | 2/2015 | Lee et al. | |
| 2015/0213889 A1* | 7/2015 | Miura | G06F 12/0246 |
| | | | 365/163 |
| 2015/0221369 A1* | 8/2015 | Jeong | G11C 13/0069 |
| | | | 365/163 |
| 2016/0054919 A1* | 2/2016 | Tao | G06F 3/061 |
| | | | 711/104 |
| 2016/0314837 A1* | 10/2016 | Harrand | G06F 11/1048 |
| 2017/0140808 A1 | 5/2017 | Jung et al. | |
| 2017/0229176 A1* | 8/2017 | Kurotsuchi | G11C 13/0004 |

* cited by examiner

METHOD OF OPERATING RESISTIVE MEMORY DEVICE CAPABLE OF REDUCING WRITE LATENCY

CROSS-REFERENCE TO RELATED APPLICATION

This application claims the benefit of priority under 35 U.S.C. § 119 to Korean Patent Application No. 10-2018-0023899, filed on Feb. 27, 2018, in the Korean Intellectual Property Office, the disclosure of which is incorporated by reference in its entirety herein.

BACKGROUND

1. Technical Field

The inventive concept relates to a non-volatile memory device, and more particularly, to a resistive memory device capable of reducing write latency, and a method of operating the same.

2. Discussion of Related Art

Non-volatile memory devices may include resistive memories such as phase-change RAM (PRAM), resistive RAM (RRAM), and magnetoresistive RAM (MRAM). A memory cell of a resistive memory includes a variable resistor for storing data based on a variation in resistance state. A cross-point resistive memory device may be realized by arranging these memory cells at intersections between multiple bit and word lines. A resistive memory device may be implemented with a material having a resistance value that varies depending on a magnitude and/or a direction of a current or voltage and is constantly maintained even when the current or voltage is cut off. A memory cell of a resistive memory device may include at least one resistor and at least one switch. Data may be stored in the memory cell by changing the resistance value of the resistor by controlling the current or voltage of a word line and a bit line connected to the memory cell.

Particularly, in a phase-change memory device, a long time is taken to write or program data. Thus methods and system capable of reducing write latency are required.

SUMMARY

At least one embodiment of the inventive concept provides a method of operating a resistive memory device capable of reducing write latency by reducing a data write operation time.

According to an exemplary embodiment of the inventive concept, there is provided a method of operating a resistive memory device including a memory cell array. The method includes the resistive memory device performing a first write operation in response to an active command and a write command, and performing a second write operation in response to a write active command and the write command. The first write operation includes a read data evaluation operation for latching data read from the memory cell array in response to the active command. The second write operation excludes the read data evaluation operation.

According to an exemplary embodiment of the inventive concept, there is provided a resistive memory device including a memory cell array including a plurality of memory cells, a read data latch configured to latch data read from the memory cells of the memory cell array based on a read data evaluation operation, a write data latch configured to latch write data to be written in the memory cells of the memory cell array, and a control circuit configured to control the resistive memory device to perform a first write operation including the read data evaluation operation based on an active command and a write command, and to perform a second write operation excluding the read data evaluation operation based on a write active command and the write command.

According to an exemplary embodiment of the inventive concept, there is provided a memory system including a resistive memory device including a plurality of memory cells, and a memory controller configured to control operation of the resistive memory device. The resistive memory device further includes a read data latch configured to latch data read from the memory cells, a write data latch configured to latch write data to be written in the memory cells, and a control circuit configured to control the resistive memory device to perform a first write operation in response to receiving an active command and a write command from the memory controller, and to perform a second write operation in response to receiving a write active command and the write command from the memory controller. The first write operation is performed by comparing bits of the read data to bits of the write data to determine different bits and writing the different data bits to one of the memory cells, and the second write operation is performed by writing all bits of the write data to the one memory cell.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
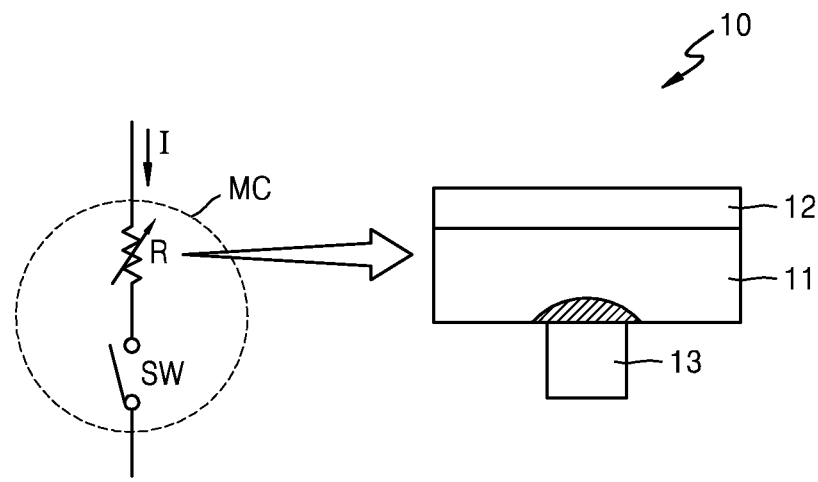
FIG. 1 is a schematic diagram of a memory cell using a method of operating a resistive memory device, according to an exemplary embodiment of the inventive concept.

FIG. 1 is a schematic diagram of a memory cell MC using a method of operating a resistive memory device, according to an exemplary embodiment of the inventive concept.

Referring to FIG. 1, the memory cell MC includes a variable resistor R and a switch SW. The switch SW may be implemented using various devices such as a transistor and a diode. As magnified in FIG. 1, the variable resistor R may include a phase-change layer 11, an upper electrode 12 provided on the phase-change layer 11, and a lower electrode 13 provided under the phase-change layer 11. In an embodiment, the phase-change layer 11 is made of a germanium (Ge)-antimony (Sb)-tellurium (Te) (GST) material.

The GST material may be programmed between an amorphous state having high resistivity and a crystalline state having low resistivity. The GST material may be programmed by heating the GST material. A heating level and time may determine whether the GST material remains in an amorphous state or in a crystalline state. The high resistivity and the low resistivity may be expressed as programmed values logic "0" and logic "1", respectively, and may be sensed by measuring resistivity of the GST material. Alternatively, the high resistivity and the low resistivity may be expressed as programmed values logic "1" and logic "0", respectively.

In FIG. 1, when a pulse current I is applied to the memory cell MC, the applied pulse current I flows through the lower electrode 13. When the pulse current I flows through the memory cell MC for a very short time, the applied pulse current I heats only a layer adjacent to the lower electrode 13 due to Joule's heat. In this case, a part of the phase-change layer 11 (e.g., a hatched part in FIG. 1) is changed to a crystalline state (or a set state) or an amorphous state (or a reset state) due to a difference in heating profile.

Figure 2:
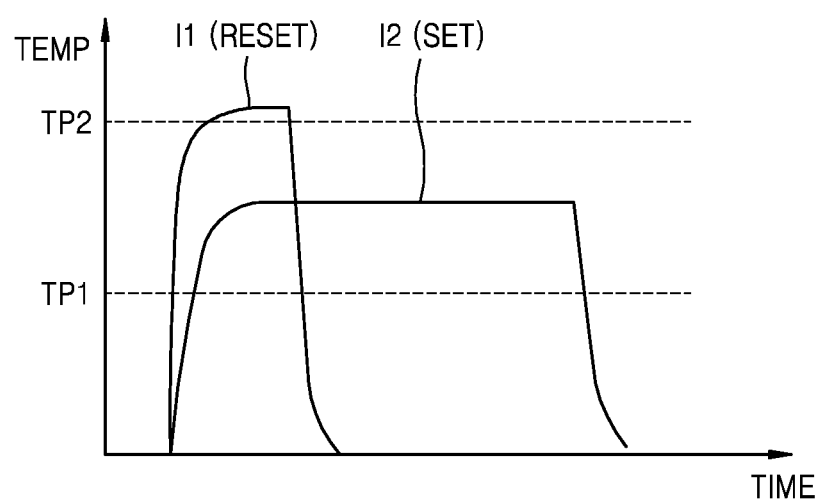
FIG. 2 is a graph for describing a write pulse applied to the memory cell of FIG. 1.

FIG. 2 is a graph for describing a write pulse applied to the memory cell MC of FIG. 1.

Referring to FIG. 2, to change the phase-change layer 11 to an amorphous state (or a reset state), a reset pulse I1 of a high current is applied to the memory cell MC for a short time and then is removed. To change the phase-change layer 11 to a crystalline state (or a set state), a set pulse I2 of a low current compared to the reset pulse I1 is applied to the memory cell MC, and the applied set pulse I2 is maintained for a certain time to crystallize the phase-change layer 11 and then is removed. The memory cell MC may be set to one of the crystalline and amorphous states as described above. In FIG. 2, TP1 indicates a crystallization temperature of the phase-change layer 11, and TP2 indicates a melting point of the phase-change layer 11.

Figure 3A:
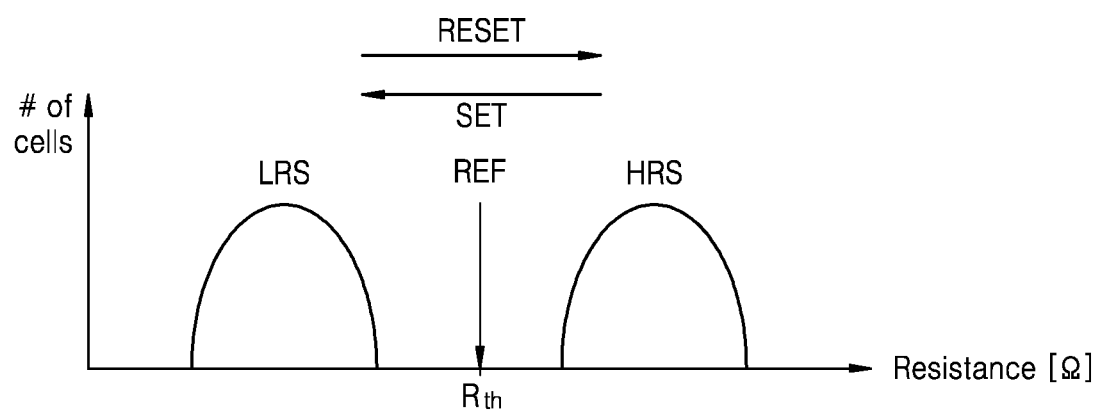
FIGS. 3A to 3C are graphs for describing characteristics of the memory cell of FIG. 1.
Figure 3B:
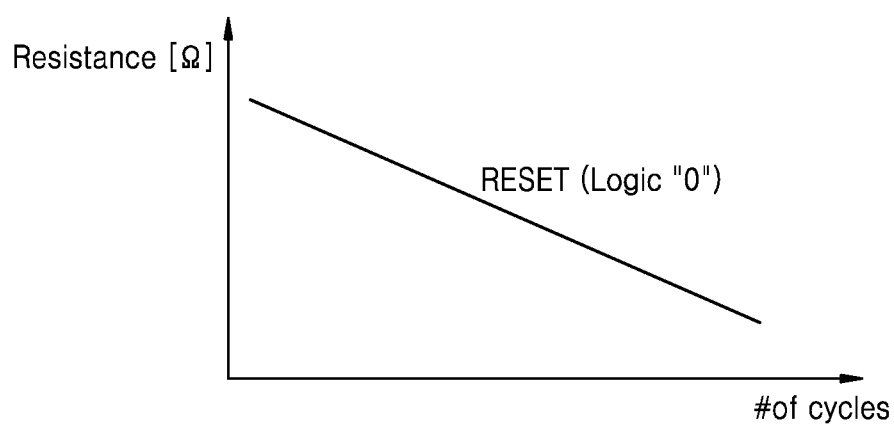
Figure 3C:
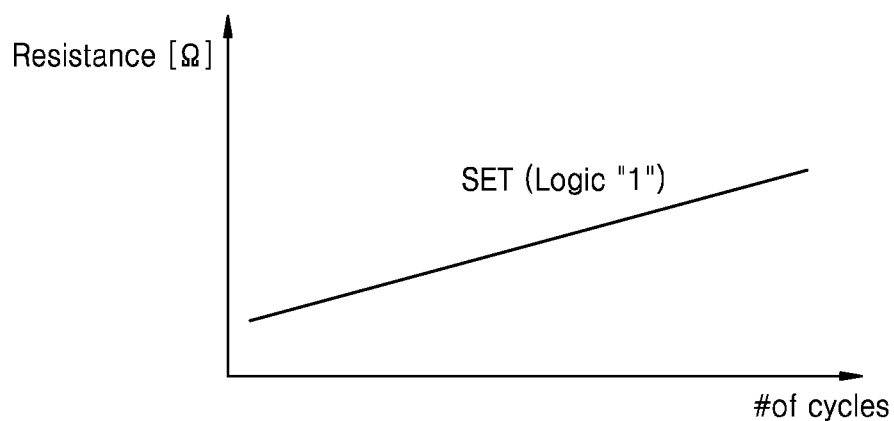

FIGS. 3A to 3C are graphs for describing characteristics of the memory cell MC of FIG. 1.

FIG. 3A shows an ideal distribution of single-level cells which are programmed using one bit. In FIG. 3A, a horizontal axis indicates a resistance, and a vertical axis indicates the number of memory cells.

The variable resistor R of the memory cell MC may have a low resistance state LRS or a high resistance state HRS. An operation of switching the variable resistor R from the high resistance state HRS to the low resistance state LRS by applying a write pulse to the memory cell MC is called a set operation or a set write operation. An operation of switching the variable resistor R from the low resistance state LRS to the high resistance state HRS by applying a write pulse to the memory cell MC is called a reset operation or a reset write operation.

An arbitrary resistance between a distribution based on the low resistance state LRS and a distribution based on the high resistance state HRS may be set as a threshold resistance $R_{th}$. In a read operation from the memory cell MC, reset data (logic "0") corresponding to the high resistance state HRS may be determined when a result of reading is equal to or greater than the threshold resistance $R_{th}$, and set data (logic "1") corresponding to the low resistance state LRS may be determined when the result of reading is less than the threshold resistance $R_{th}$. When the memory cell MC is continuously set to the reset data (logic "0") or the set data (logic "1"), the performance of the memory cell MC may be degraded as illustrated in FIGS. 3B and 3C.

FIG. 3B shows example performance of the memory cell MC continuously programmed to the reset data of logic "0" by applying a high current. In FIG. 3B, a horizontal axis indicates the number of program cycles, and a vertical axis indicates a resistance. In an early stage, resistivity of the memory cell MC behaves well and thus the phase-change layer 11 has a high resistance. However, when the memory cell MC is continuously programmed to the reset data of logic "0" without being arbitrarily intervening-programmed to the set data of logic "1", the resistance of the memory cell MC may be reduced. As such, a sensing margin between the set data of logic "1" and the reset data of logic "0" is reduced and, consequently, sensing of the reset data of logic "0" may become unclear, slow, or unreliable.

FIG. 3C shows that degradation of the reset data of logic "0" may also occur in the set data of logic "1". When the memory cell MC is continuously programmed to the set data of logic "1" without being arbitrarily intervening-programmed to the reset data of logic "0", the resistance of the memory cell MC may be increased by a function of the number of program cycles. Although degradation of the set data of logic "1" occurs less compared to degradation of the reset data of logic "0", an inadvertent increase in resistivity of the set data of logic "1" tends to reduce the sensing margin between the set data of logic "1" and the reset data of logic "0" and to reduce reliability of the resistive memory device.

To solve the resistivity degradation problems of the memory cell MC, the resistive memory device latches write data to be written at an address in the memory cell MC and reads and latches data which is currently present at the address, during an operation based on a write command for the address. The latched write data is compared to the latched read data bit-by-bit to determine whether the bits are matched. Based on a result of the comparison, only different data bits are programmed in the memory cells MC and matched data bits are not unnecessarily programmed. Since the matched data bits are ignored in a program operation, reliability problems related to redundant programming may be reduced.

However, a time taken to read memory cell data, latch the read data, and compare write data to the read data in a write operation to prevent redundant programming increases write latency. When the memory cell data is not read, latched, and compared in the write operation to reduce the write latency of the resistive memory device, a write operation time may be ultimately reduced. The inventive concept will now be described in detail in relation to a resistive memory device capable of reducing write latency by performing a write operation by using a write active command and a write command.

Figure 4:
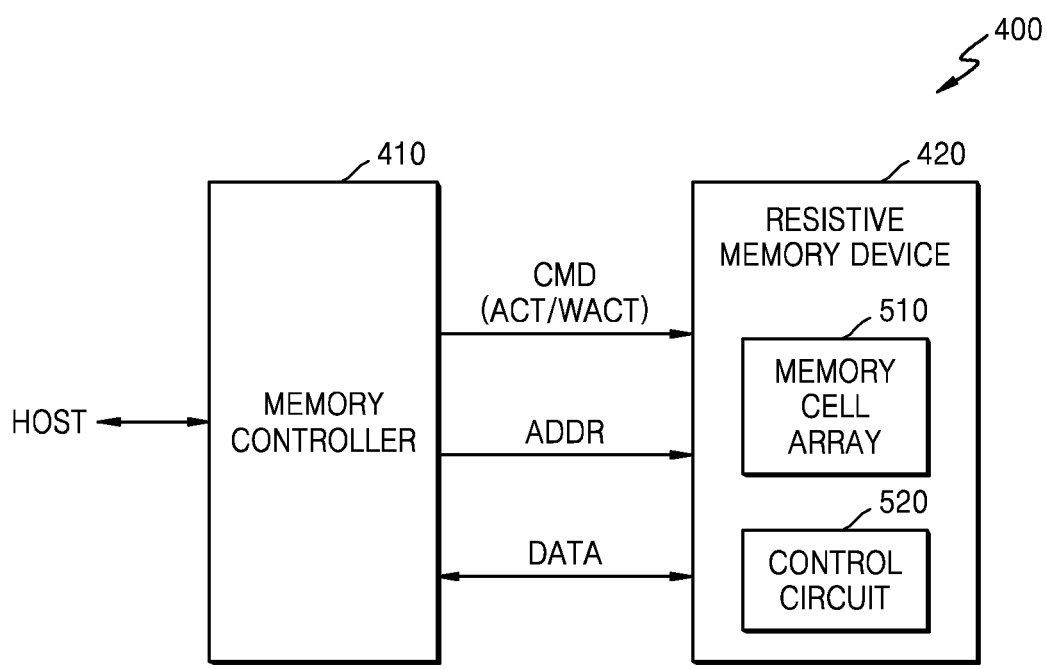
FIG. 4 is a block diagram of a memory system for describing an exemplary embodiment of the inventive concept.

FIG. 4 is a block diagram of a memory system 400 for describing an embodiment of the inventive concept.

Referring to FIG. 4, the memory system 400 includes a memory controller 410 and a resistive memory device 420. The memory controller 410 controls the resistive memory device 420 to read data stored in the resistive memory device 420 in response to a read request or to write data in the resistive memory device 420 in response to a write request from a host HOST. The memory controller 410 may control a write, program, or read operation in or from the resistive memory device 420 by providing a command CMD and an address ADDR to the resistive memory device 420 based on the request. In addition, data DATA to be written and read data DATA may be transmitted and received between the memory controller 410 and the resistive memory device 420.

The memory controller 410 may include random access memory (RAM), a processing unit, a host interface, and a memory interface. The RAM may be used as an operating memory of the processing unit, and the processing unit may control operations of the memory controller 410. The host interface may include a protocol for exchanging data between the host HOST and the memory controller 410. For example, the memory controller 410 may be configured to communicate with the host HOST by using at least one of various interface protocols such as universal serial bus (USB), multimedia card (MMC), peripheral component interconnect express (PCI-E), advanced technology attachment (ATA), serial-ATA, parallel-ATA, small computer system interface (SCSI), enhanced small disk interface (ESDI), and integrated drive electronics (IDE) protocols.

The resistive memory device 420 includes a memory cell array 510 and a control circuit 520. The memory cell array 510 may include multiple memory cells, and the multiple memory cells may be provided at intersections between multiple bit lines and multiple word lines. In an embodiment, each memory cell is a single-level cell for storing data of one bit. In this embodiment, the memory cells may have two resistance distributions as illustrated in FIG. 3A, depending on the state of the stored data. In another embodiment, each memory cell is a multi-level cell capable of storing data of two bits. In this embodiment, the memory cells have four resistance distributions depending on the state of the stored data. In another embodiment, each memory cell has a triple-level cell capable of storing data of three bits. In this embodiment, the memory cells have eight resistance distributions depending on the state of the stored data. However, the inventive concept is not limited thereto For example, in another embodiment, the memory cell array 510 includes memory cells each capable of storing data four or more bits. Alternatively, the memory cell array 510 may include single-level cells and multi-level cells or triple-level cells.

In the current embodiment, the multiple memory cells include resistive memory cells each including a variable resistor having a resistance which varies depending on the state of stored data. For example, when the variable resistor is made of a phase-change material (e.g., GST) having a resistance which varies depending on temperature, the resistive memory device 420 may be phase-change RAM (PRAM). As another example, when the variable resistor includes an upper electrode, a lower electrode, and transition metal oxide (or complex metal oxide) between the upper and lower electrodes, the resistive memory device 420 may be resistive RAM (RRAM). As another example, when the variable resistor includes a magnetic upper electrode, a magnetic lower electrode, and a dielectric between the magnetic upper and lower electrodes, the resistive memory device 420 may be magnetoresistive RAM (MRAM).

Figure 5:
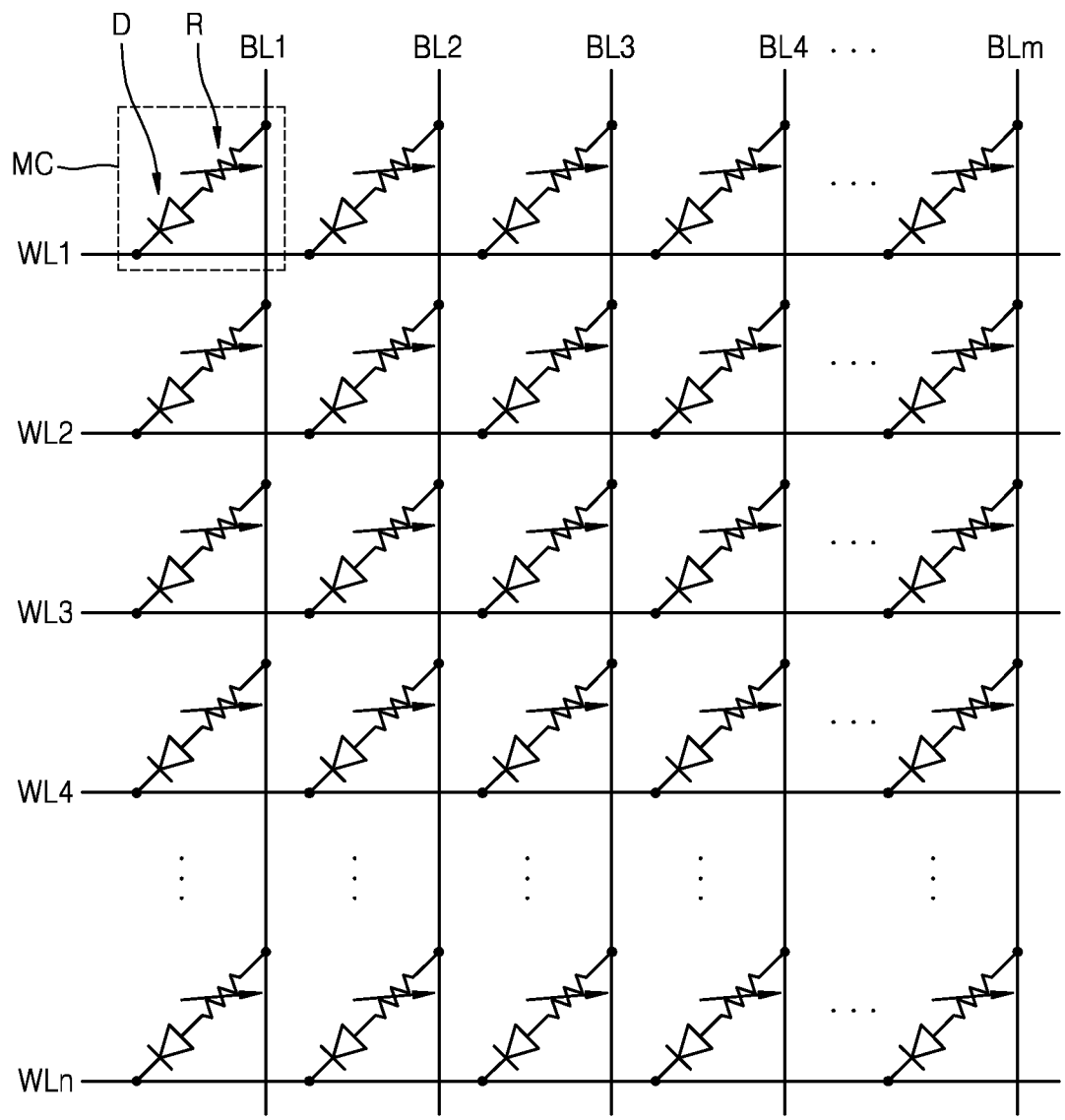
FIG. 5 is a circuit diagram of a memory cell array of FIG. 4.

As illustrated in FIG. 5, the memory cell array 510 may be a 2-dimensional memory having a horizontal structure and may include multiple word lines WL1 to WLn, multiple bit lines BL1 to BLm, and multiple memory cells MC. Herein, the number of word lines WL, the number of bit lines BL, and the number of memory cells MC may be variously changed according to embodiments. However, the inventive concept is not limited thereto and, in another embodiment, the memory cell array 510 may be a 3-dimensional memory having a vertical structure.

According to the current embodiment, each of the multiple memory cells MC is a 1D1R memory cell including a variable resistor R and a selector D. Herein, the variable resistor R may be referred to as a variable resistance material, and the selector D may be referred to as a switch. In an embodiment, the selector D is implemented by a diode.

In an embodiment, the variable resistor R is connected between one of the multiple bit lines BL1 to BLm and the selector D, and the selector D is connected between the variable resistor R and one of the multiple word lines WL1 to WLn. However, the inventive concept is not limited thereto. For example, the selector D may be connected between one of the multiple bit lines BL1 to BLm and the variable resistor R and the variable resistor R may be connected between the selector D and one of the multiple word lines WL1 to WLn.

The variable resistor R may be changed to one of a plurality of resistance states due to an applied electric pulse. In an embodiment, the variable resistor R includes a phase-change material having a crystalline state which varies depending on the amount of current applied to the material. The phase-change material may include various types of materials, e.g., two-element compounds such as GaSb, InSb, InSe, $Sb_2Te_3$, and GeTe, three-element compounds such as GeSbTe, GaSeTe, InSbTe, $SnSb_2Te_4$, and InSbGe, and four-element compounds such as AgInSbTe, (GeSn)SbTe, GeSb (SeTe), and $Te_{81}Ge_{15}Sb_2S_2$.

In another embodiment, instead of the phase-change material, the variable resistor R include perovskite compounds, a transition metal oxide, magnetic materials, ferromagnetic materials, or antiferromagnetic materials.

The selector D may be connected between one of the multiple word lines WL1 to WLn and a variable resistor R to control supply of current to the variable resistor R based on a voltage applied to the connected word and bit lines. Although the selector D is illustrated as a diode in FIG. 5, the inventive concept is not limited thereto. For example, in another embodiment, the selector D is implemented by another device having a switching function.

Figure 6A:
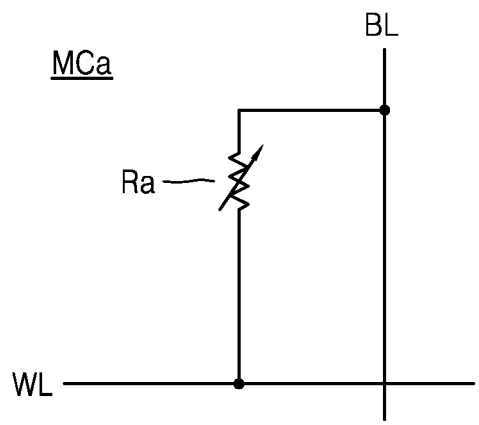
FIGS. 6A to 6C are circuit diagrams for describing modified examples of a memory cell included in the memory cell array of FIG. 5.
Figure 6B:
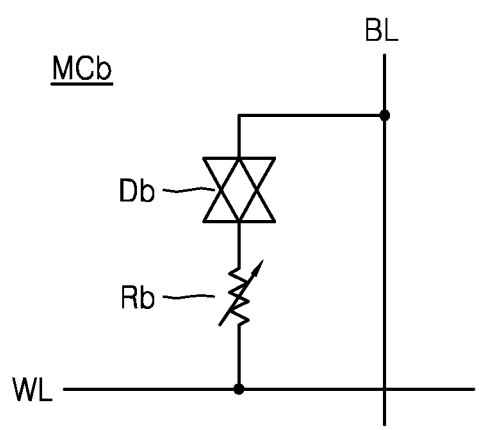
Figure 6C:
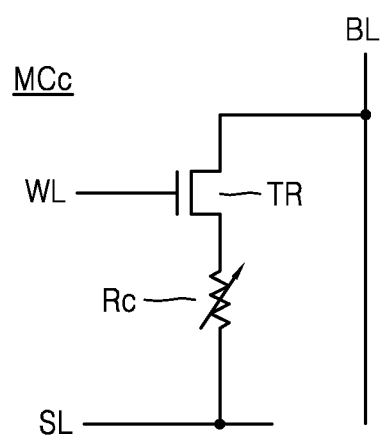

Modified examples of the memory cell MC of FIG. 5 are illustrated in FIGS. 6A to 6C. Referring to FIG. 6A, a memory cell MCa includes a variable resistor Ra, and the variable resistor Ra is connected between the bit line BL and the word line WL. The memory cell MCa may store data due to voltages applied to the bit line BL and the word line WL.

Referring to FIG. 6B, a memory cell MCb includes a variable resistor Rb and a bidirectional diode Db. The variable resistor Rb includes a resistive material for storing data. The bidirectional diode Db is connected between the variable resistor Rb and the bit line BL, and the variable resistor Rb is connected between the word line WL and the bidirectional diode Db. The positions of the bidirectional diode Db and the variable resistor Rb may be switched. The bidirectional diode Db may block a leakage current flowing through a non-selected resistive cell.

Referring to FIG. 6C, a memory cell MCc includes a variable resistor Rc and a transistor TR. The transistor TR may act as a selector (i.e., a switch) for supplying or blocking a current to or from flowing to the variable resistor Rc based on a voltage of the word line WL. In the embodiment of FIG. 6C, a source line SL for controlling voltage levels of two ends of the variable resistor Rc may be further provided. The transistor TR is connected between the variable resistor Rc and the bit line BL, and the variable resistor Rc is connected between the source line SL and the transistor TR. The source line SL may be a ground voltage line. The positions of the transistor TR and the variable resistor Rc may be switched. The memory cell MCc may be or not be selected based on whether the transistor TR driven by the word line WL is turned on or off (e.g., controlled to pass current or prevent current from passing).

Referring back to FIG. 4, the control circuit 520 may control write, program, and read operations in or from the memory cell array 510 in response to the command CMD received from the memory controller 410. The control circuit 520 controls a bank active state of the memory cell array 510 based on an address ADDR including a bank address and/or a row address received together with an active command ACT. In the bank active state, the control circuit 520 enables circuits associated with a bank activated based on the bank address, activates a word line selected in the activated bank by decoding the row address, and performs a read data evaluation operation for reading and latching data of memory cells of the memory cell array 510, which are connected to the selected word line.

Figure 8:
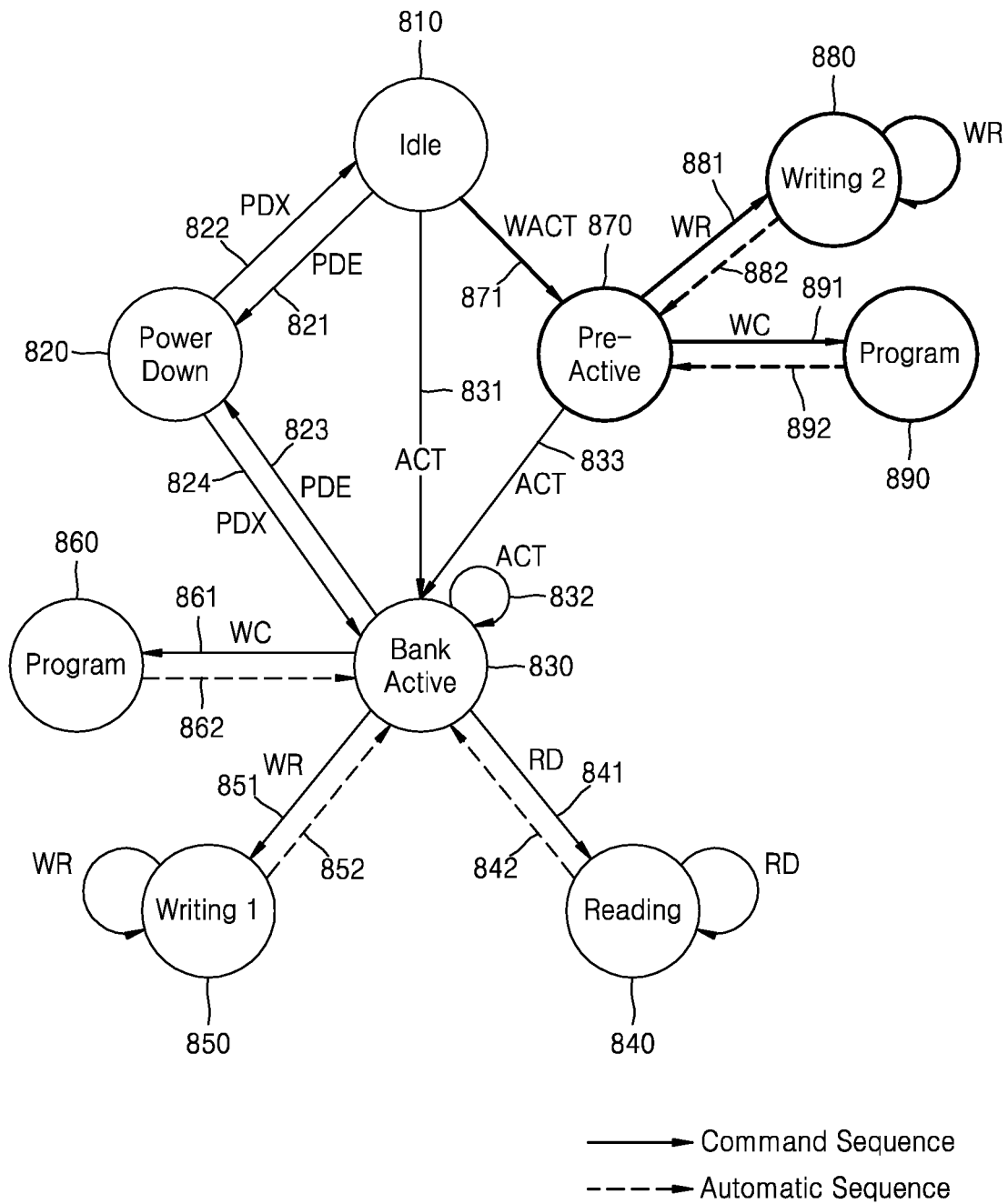
FIG. 8 is a state diagram of the resistive memory device according to a conceptual embodiment of the inventive concept.

The control circuit 520 may perform a read operation in response to a read command RD (see FIG. 8). The control circuit 520 may output the data read from the memory cell array 510 having the bank active state to the memory controller 410 as output data DATA.

In an embodiment, the control circuit 520 performs a first write operation in response to the active command ACT and a write command WR (see FIG. 8). In the first write operation, the control circuit 520 latches write data received together with the write command WR and compares bits of the data read from the memory cell array 510 having the bank active state, to bits of the write data. The control circuit 520 programs bits of the write data, which are determined to be different from bits of the read data as a result of the comparison, as set or reset data in memory cells of the memory cell array 510 of the activated bank in response to a write confirm command WC (see FIG. 8).

The control circuit 520 performs a second write operation in response to a write active command WACT and the write command WR. In the second write operation, the control circuit 520 controls a pre-active state of the memory cell array 510 based on an address ADDR including a bank address and/or a row address received together with the write active command WACT. In the pre-active state, the control circuit 520 enables circuits associated with a bank activated based on the bank address and activates a word line selected in the activated bank by decoding the row address. In the second write operation, the control circuit 520 latches write data received together with the write command WR. The control circuit 520 programs all bits of the write data as set or reset data in memory cells of the memory cell array 510 of the activated bank in response to the write confirm command WC.

As described above, the control circuit 520 does not perform the read data evaluation operation and the comparison operation of the first write operation in the second write operation which is performed in response to the write active command WACT and the write command WR. As such, a time taken for the second write operation may be reduced compared to a time taken for the first write operation. In an exemplary embodiment, the resistive memory device 420 selectively uses the first write operation or the second write operation. For example, the resistive memory device 420 may choose being the first write operation and the second write operation based on the type of command (e.g., ACT or WACT) received before a write command. In particular, by selectively using the second write operation, a write operation time may be reduced and thus write latency may also be reduced. Accordingly, a write operation speed may be increased. In an embodiment, the ACT command is represented by a particular voltage or voltage pattern (one or more pulses) that differs from that of the WACT command so that the control circuit 520 can distinguish them from one another.

The memory controller 410 and the resistive memory device 420 may be integrated into a single semiconductor device. Specifically, the memory controller 410 and the resistive memory device 420 may be integrated into a single semiconductor device to implement a memory card. For example, the memory controller 410 and the resistive memory device 420 may be integrated into a single semiconductor device to implement a Personal Computer Memory Card International Association (PCMCIA) card, a compact flash (CF) card, a smart media card (SM/SMC), a memory stick, a multimedia card (MMC), a reduced-size (RS)-MMC, an MMC micro, a secure digital (SD) card, a mini SD card, a micro SD card, a universal flash storage (UFS), or the like. As another example, the memory controller 410 and the resistive memory device 420 may be integrated into a single semiconductor device to implement a solid state disk/drive (SSD).

Figure 7:
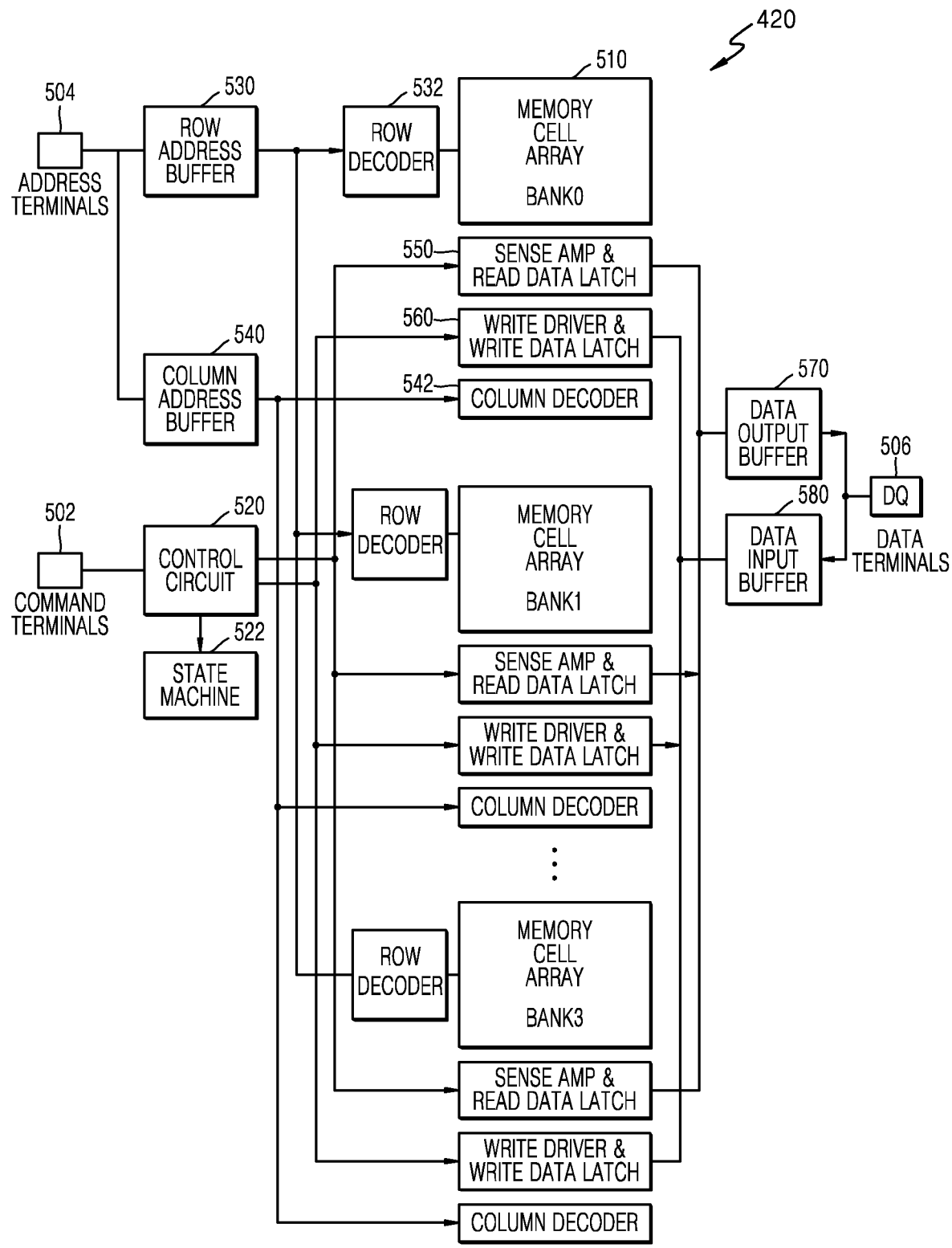
FIG. 7 is a block diagram of a resistive memory device according to an exemplary embodiment of the inventive concept.

FIG. 7 is a block diagram of a resistive memory device 420 according to an exemplary embodiment of the inventive concept. The resistive memory device 420 of FIG. 7 is an example of the resistive memory device 420 included in the memory system 400 of FIG. 4.

Referring to FIG. 7, the resistive memory device 420 has a 4-bank configuration. Circuits connected to each bank include a memory cell array 510, a row decoder 532 (e.g., row decoding circuit) for decoding a row address to select a word line WL, a column decoder 542 (e.g., column decoding circuit) for decoding a column address to set a selected column switch to an on state, a sense amplifier and read data latch 550, and a write driver and write data latch 560. Although the resistive memory device 420 has a 4-bank configuration in FIG. 7, the inventive concept is not limited thereto. For example, in another embodiment, the resistive memory device 420 has less than 4 banks or more than 4 banks.

Circuits commonly connected to all banks include a control circuit 520, a state machine 522 (e.g., a logic circuit implementing a finite-state machine), a row address buffer 530, a column address buffer 540, a data output buffer 570, and a data input buffer 580. The row address buffer 530 and the column address buffer 540 are connected to address terminals 504. A bank address, a row address, and a column address may be input through the address terminals 504.

The control circuit 520 is connected to command terminals 502. At least one of a clock signal CLK, a clock enable signal /CKE, a chip selection signal /CS, a row address strobe signal/RAS, a column address strobe signal/CAS, a write enable signal/WE, a data mask signal DQM, etc. may be input to the command terminals 502. The control circuit 520 may generate control signals corresponding to a command CMD by decoding the signals applied to the command terminals 502. The state machine 522 may control states (see FIG. 8) according to access cycles based on the command CMD of the control circuit 520.

The sense amplifier and read data latch 550 of each bank may latch data read from memory cells of the memory cell array 510 of the bank and, in a read operation of the bank, the read data may be output through the data output buffer 570 to data terminals 506. The write driver and write data latch 560 of each bank may latch write data applied through the data terminals 506 and the data input buffer 580 and to be written in memory cells of the memory cell array 510 of the bank.

In a write operation of each bank, the write driver and write data latch 560 of the bank may compare the read data latched in the sense amplifier and read data latch 550 to the write data latched in the write driver and write data latch 560. In an exemplary embodiment, the write driver and write data latch 560 program only bits of the write data, which are determined to be different from bits of the read data as a result of the comparison, as set or reset data in memory cells of the memory cell array 510 of the bank.

Alternatively, in a write operation of each bank, the write driver and write data latch 560 of the bank program all bits of the write data as set or reset data in memory cells of the memory cell array 510 of the bank without comparing the read data latched in the sense amplifier and read data latch 550 to the write data latched in the write driver and write data latch 560 bit-by-bit.

FIG. 8 is a state diagram of the resistive memory device 420 according to a conceptual embodiment of the inventive concept.

Referring to FIG. 8, the resistive memory device 420 (see FIG. 7) may be in one of a plurality of operation mode states. For example, the resistive memory device 420 may have an idle state 810, a power down mode state 820, a bank active state 830, a read mode state 840, a first write mode state 850, a second write mode state 880, program mode states 860 and 890, and a pre-active state 870.

The idle state 810 indicates a state in which the resistive memory device 420 does not operate, i.e., a state in which the resistive memory device 420 is not accessed. For example, when the memory controller 410 (see FIG. 4) does not issue a command CMD or when the host HOST (see FIG. 4) is in a sleep mode, the resistive memory device 420 may be in the idle state 810.

The power down mode state 820 indicates a state in which most circuits of the resistive memory device 420 in the idle state 810 are disabled in response to a power down entry command PDE 821. The power down mode state 820 is a state in which power consumption of the resistive memory device 420 is the lowest. The resistive memory device 420 may enable the circuits disabled in the power down mode state 820 and transit to the idle state 810 in response to a power down exit command PDX 822.

The bank active state 830 indicates a state to which the resistive memory device 420 in the idle state 810 transits to perform a read, a write, a program, or other operation in response to an active command ACT 831. In an embodiment, the active command ACT 831 is applied to the resistive memory device 420 together with a bank address and a row address. In the bank active state 830, circuits associated with a bank activated based on the bank address are enabled. In the following description, for convenience of explanation, it is assumed that a first bank BANK0 is activated based on the bank address in the bank active state 830. For example, circuits such as the row decoder 532, the sense amplifier and read data latch 550, the write driver and write data latch 560, and the column decoder 542 of the activated bank are enabled.

In the bank active state 830 in which the first bank BANK0 is activated, data of memory cells of the memory cell array 510, which are connected to a word line WL selected by the row decoder 532 as a result of decoding the row address, may be read and latched in the sense amplifier and read data latch 550. While in the bank active state 830 of the first bank BANK0, an active command ACT 832 for activating another bank, e.g., one of second to fourth banks BANK1, BANK2, and BANK3, may be applied to the resistive memory device 420.

The resistive memory device 420 may transit from the bank active state 830 to the power down mode state 820 in response to a power down entry command PDE 823, and transit from the power down mode state 820 to the bank active state 830 in response to a power down exit command PDX 824.

The resistive memory device 420 may transit from the bank active state 830 to the read mode state 840 for performing a read operation, in response to a read command RD 841. In the read mode state 840, the read data of the memory cell array 510, which is latched in the sense amplifier and read data latch 550 in the bank active state 830 of the first bank BANK0, may be output through the data output buffer 570 to the data terminals 506. When the read operation is completed in the read mode state 840, the resistive memory device 420 may automatically transit to the bank active state 830 (842).

The resistive memory device 420 may transit from the bank active state 830 to the first write mode state 850 for performing a write operation, in response to a write command WR 851. In the first write mode state 850, write data input through the data terminals 506 and the data input buffer 580 are latched in the write driver and write data latch 560 of the first bank BANK0. Furthermore, in the first write mode state 850, bits of the read data latched in the sense amplifier and read data latch 550 of the first bank BANK0 are compared to bits of the write data latched in the write driver and write data latch 560. Bits of the write data, which are determined to be different from bits of the read data as a result of the comparison in the first write mode state 850, are programmed as set or reset data in memory cells of the memory cell array 510 of the first bank BANK0. When the write operation is completed in the first write mode state 850, the resistive memory device 420 may automatically transit to the bank active state 830 (852).

The resistive memory device 420 may transit from the bank active state 830 to the program mode state 860 for performing a program operation, in response to a write confirm command WC 861. In the program mode state 860, bits of the write data, which are determined to be different from bits of the read data as a result of the comparison in the first write mode state 850, are selectively programmed. As illustrated in FIGS. 2 and 3, a reset data program operation may be performed by applying the reset pulse I1 to the memory cell MC for a short time. A set data program operation may be performed by applying the set pulse I2 lower than the reset pulse I1, to the memory cell MC for a certain time to crystallize the phase-change layer 11 of the memory cell MC. When the program operation is completed in the program mode state 860, the resistive memory device 420 may automatically transit to the bank active state 830.

The pre-active state 870 indicates a state to which the resistive memory device 420 of the idle state 810 transits to perform a write or program operation in response to a write active command WACT 871. The write active command WACT 871 may be applied to the resistive memory device 420 together with a bank address and a row address. In the pre-active state 870, circuits associated with a bank activated based on the bank address, e.g., the first bank BANK0, are enabled.

In the pre-active state 870, an active command ACT 833 for activating another bank, e.g., one of the second to fourth banks BANK1, BANK2, and BANK3, may be applied to the resistive memory device 420. The resistive memory device 420 may transit from the pre-active state 870 to the bank active state 830 in response to the active command ACT 833.

The resistive memory device 420 may transit from the pre-active state 870 to the second write mode state 880 for performing a write operation, in response to a write command WR 881. In the second write mode state 880, write data input through the data terminals 506 and the data input buffer 580 may be latched in the write driver and write data latch 560 of the first bank BANK0. When the write operation is completed in the second write mode state 880, the resistive memory device 420 may automatically transit to the pre-active state 870 (882).

The resistive memory device 420 may transit from the pre-active state 870 to the program mode state 890 for performing a program operation, in response to a write confirm command WC 891. In the program mode state 890, all bits of write data input in the second write mode state 880 is programmed. As illustrated in FIGS. 2 and 3, a reset data program operation may be performed by applying the reset pulse I1 to the memory cell MC for a short time. A set data program operation may be performed by applying the set pulse I2 lower than the reset pulse I1, to the memory cell MC for a certain time to crystallize the phase-change layer 11 of the memory cell MC. When all bits of the write data are completely programmed in the program mode state 890, the resistive memory device 420 may automatically transit to the pre-active state 870.

Figure 9A:
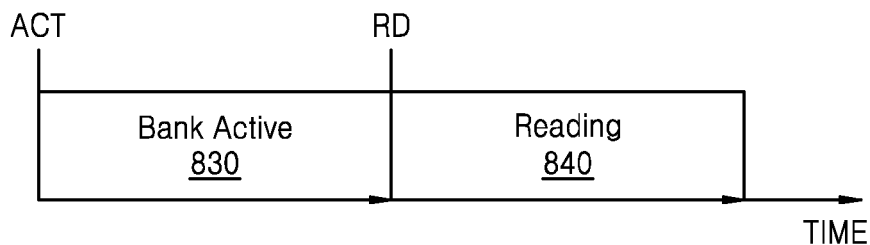
FIGS. 9A to 9C are timing diagrams of read and write operations of the resistive memory device, according to an exemplary embodiment of the inventive concept.
Figure 9A:
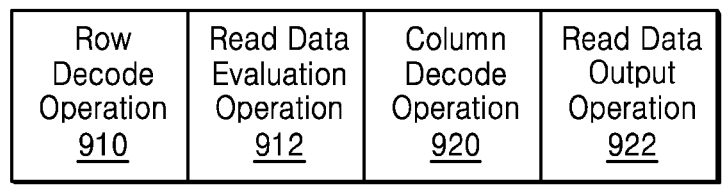
Figure 9B:
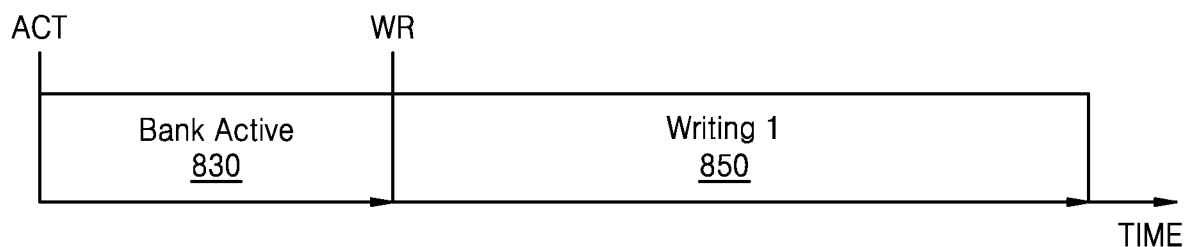
Figure 9B:
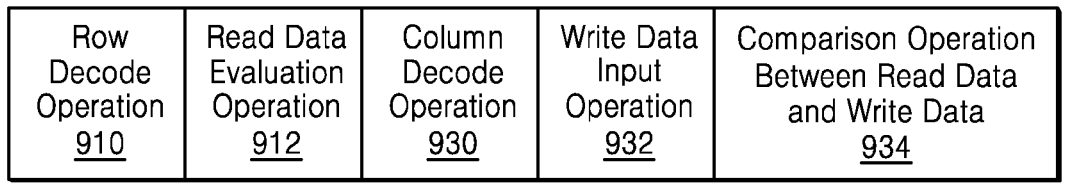
Figure 9C:
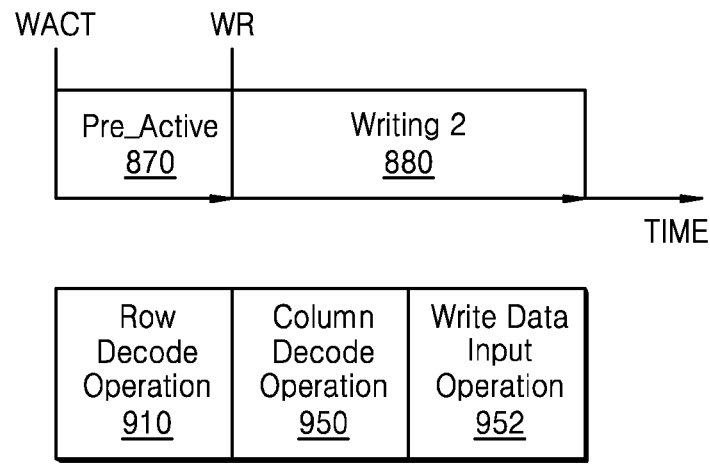

FIGS. 9A to 9C are timing diagrams of read and write operations of the resistive memory device 420, according to an exemplary embodiment of the inventive concept.

In connection with FIGS. 7 and 8, FIG. 9A shows a timing diagram of a read operation of the resistive memory device 420. The read operation may be performed based on an active command ACT and a read command RD. During a time span from the start of the active command ACT to the start of the read command RD, the resistive memory device 420 is in the bank active state 830.

During the bank active state 830, the resistive memory device 420 performs a row decode operation 910 and a read data evaluation operation 912. The row decode operation 910 may include operations of receiving a bank address and a row address applied to the resistive memory device 420, activating a bank corresponding to the bank address, decoding the row address by using the row decoder 532 of the activated bank, and activating a selected word line WL identified as a result of decoding the row address. The read data evaluation operation 912 may include an operation of reading data of memory cells of the memory cell array 510, which are connected to the word line WL selected by the row decoder 532, and latching the read data in the sense amplifier and read data latch 550.

The resistive memory device 420 may transit from the bank active state 830 to the read mode state 840 based on the read command RD. In the read mode state 840, a column decode operation 920 and a read data output operation 922 may be performed. The column decode operation 920 may include operations of receiving a column address applied to the resistive memory device 420 and decoding the column address by using the column decoder 542 of the activated bank. The read data output operation 922 may include an operation of outputting the read data of the memory cell array 510, which is latched in the sense amplifier and read data latch 550 in the bank active state 830, through the data output buffer 570 to the data terminals 506.

FIG. 9B shows a timing diagram of a first write operation of the resistive memory device 420. The first write operation may be performed based on an active command ACT and a write command WR. During a time span from the start of the active command ACT to the start of the write command WR, the resistive memory device 420 is in the bank active state 830.

During the bank active state 830, as described above in relation to FIG. 9A, the resistive memory device 420 may perform the row decode operation 910 for activating a selected word line WL of an activated bank, and the read data evaluation operation 912 for latching read data in the sense amplifier and read data latch 550.

The resistive memory device 420 may transit from the bank active state 830 to the first write mode state 850 based on the write command WR. In the first write mode state 850, a column decode operation 930, a write data input operation 932, and a comparison operation 934 between read data and write data may be performed.

The column decode operation 930 may include operations of receiving a column address applied to the resistive memory device 420 and decoding the column address by using the column decoder 542 of the bank. The write data input operation 932 may include an operation of latching write data input through the data terminals 506 and the data input buffer 580, in the write driver and write data latch 560 of the activated bank. The comparison operation 934 may include an operation of comparing bits of the read data latched in the sense amplifier and read data latch 550, to bits of the write data latched in the write driver and write data latch 560.

Bits of the write data, which are determined to be different from bits of the read data as a result of the comparison operation 934, may be programmed as set or reset data in memory cells of the memory cell array 510 of the bank in the program mode state 860 based on a write confirm command WC.

FIG. 9C shows a timing diagram of a second write operation of the resistive memory device 420. The second write operation may be performed based on a write active command WACT and a write command WR. During a time span from the start of the write active command WACT to the start of the write command WR, the resistive memory device 420 is in the pre-active state 870.

During the pre-active state 870, the resistive memory device 420 performs a row decode operation 910. The row decode operation 910 may include operations of receiving a bank address and a row address applied to the resistive memory device 420, activating a bank corresponding to the bank address, decoding the row address by using the row decoder 532 of the activated bank, and activating a selected word line WL identified as a result of the decoding.

The resistive memory device 420 may transit from the pre-active state 870 to the second write mode state 880 based on the write command WR. In the second write mode state 880, a column decode operation 950 and a write data input operation 952 may be performed.

The column decode operation 950 may include operations of receiving a column address applied to the resistive memory device 420 and decoding the column address by using the column decoder 542 of the bank. The write data input operation 952 may include an operation of latching write data input through the data terminals 506 and the data input buffer 580, in the write driver and write data latch 560 of the activated bank. Bits of the write data latched in the write driver and write data latch 560 may be programmed as set or reset data in memory cells of the memory cell array 510 of the bank in the program mode state 890 based on a write confirm command WC.

The first write operation of FIG. 9B may be performed within a relatively long time due to the read data evaluation operation 912 and the comparison operation 934 between read data and write data. On the contrary, compared to the first write operation, the second write operation of FIG. 9C does not include the read data evaluation operation 912 and the comparison operation 934 and thus may be performed within a relatively short time. As such, the resistive memory device 420 may reduce write latency based on the second write operation.

In the pre-active state 870 of the second write operation, the row decode operation 940 may be performed within several nanoseconds (ns). The time taken for the row decode operation 940 in the pre-active state 870 of the resistive memory device 420 may correspond to a /RAS-to-/CAS delay (tRCD) timing parameter of a dynamic RAM (DRAM). Since the tRCD time of the DRAM is about 10 ns to about 20 ns, the resistive memory device 420 may be considered as a substitute for the DRAM.

Figure 10:
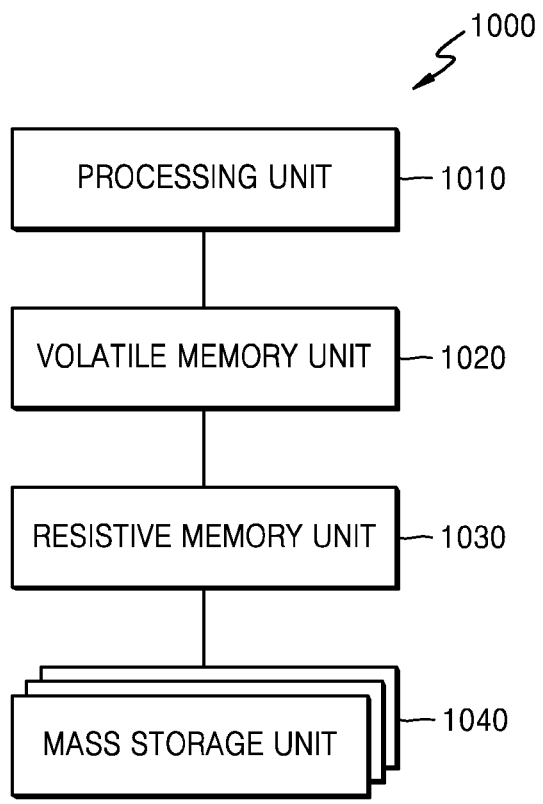
FIG. 10 is a block diagram of a system including a resistive memory device according to exemplary embodiment of the inventive concept.

FIG. 10 is a block diagram of a system 1000 including a resistive memory device according to an exemplary embodiment of the inventive concept.

Referring to FIG. 10, the system 1000 includes a processing unit 1010, a volatile memory unit 1020 (e.g., a volatile memory device), a resistive memory unit 1030 (e.g., a resistive memory device), and a mass storage unit 1040. The system 1000 may be a general- or special-use computer system such as a mobile device, a personal computer, a server computer, a programmable home appliance, or a mainframe computer.

The functional units described in the current embodiment are labeled as modules for implementation independence. For example, the modules may be implemented as hardware circuits including existing semiconductor devices such as custom very-large-scale integration (VLSI) circuits or gate arrays, logic chips, transistors, or other discrete components. The modules may also be implemented as programmable hardware devices, e.g., programmable gate arrays, programmable gate logics, or programmable gate devices. In addition, the modules may also be implemented as software configured as executable codes, objects, procedures, or functions.

The processing unit 1010 may execute an operating system and a plurality of software systems and perform certain calculations or tasks. The processing unit 1010 may be a microprocessor or a central processing unit (CPU).

The volatile memory unit 1020 serves as operating memory or cache memory of the system 1000 and refers to a medium for storing data for a short term or in a temporary manner. The volatile memory unit 1020 may include at least one volatile memory device (e.g., DRAM).

The resistive memory unit 1030 may be used as cache memory of the mass storage unit 1040. The resistive memory unit 1030 may store frequently accessed applications or a part of data of the operating system. The resistive memory unit 1030 may include at least one memory device (e.g., PRAM). Since data access to the resistive memory unit 1030 is much faster than that to the mass storage unit 1040 such as a hard disk drive (HDD), the resistive memory unit 1030 may be useful as cache memory. The resistive memory unit 1030 may be implemented using the embodiments described above in relation to FIGS. 1 to 9C.

The resistive memory unit 1030 may perform a first write operation in response to an active command (ACT) and a write command and perform a second write operation in response to a write active command (WACT) and the write command. In an embodiment, the first write operation includes a read data evaluation operation for reading data stored in memory cells in a bank active state based on the active command, and a comparison operation for receiving write data and comparing the write data to the read data in a first write mode state based on the write command. In an embodiment, the second write operation includes a pre-active state for receiving a bank address and a row address in response to the write active command, and a second write mode state for receiving bits of the write data in response to the write command. The second write operation does not include the read data evaluation operation and the comparison operation of the first write operation. As such, a time taken for the second write operation may be reduced compared to a time taken for the first write operation. In an embodiment, the resistive memory unit 1030 is configured to selectively use the first write operation and the second write operation. In particular, by using the selective second write operation, a write operation time may be reduced and thus write latency may also be reduced.

The mass storage unit 1040 may be implemented as an HDD, a solid state drive (SDD), a peripheral component interconnect express (PCIe) memory module, non-volatile memory express (NVMe), or the like. Optionally, one or more tiers of the mass storage unit 1040 may be implemented as one or more network-accessible devices and/or services, e.g., NVMe-over Fabrics (NVMe-oF)- and/or Remote Direct Memory Access (RDMA)-connected clients, servers, server farm(s), server cluster(s), application server (s), or message server(s). The mass storage unit 1040 refers to a storage medium used when the system 1000 stores user data for a long term. The mass storage unit 1040 may store application programs, program data, etc.

Figure 11:
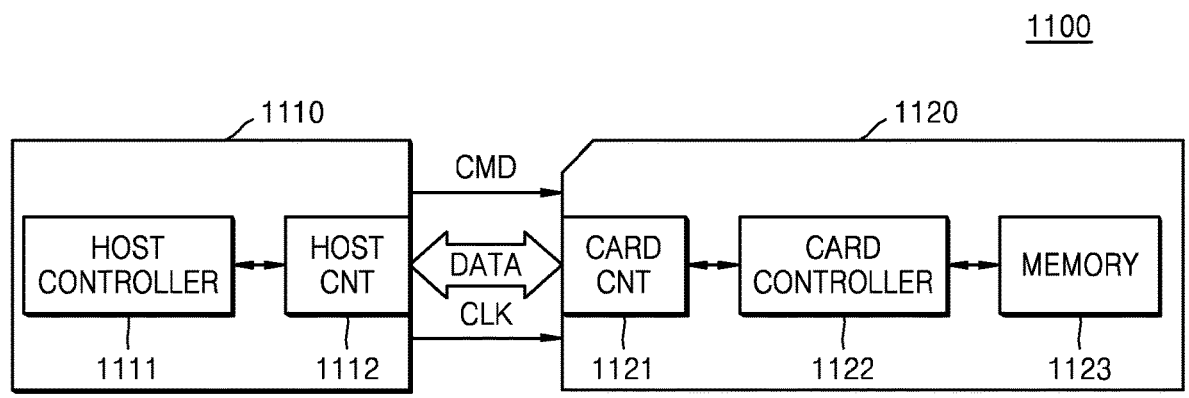
FIG. 11 is a block diagram of a memory card system using a resistive memory device according to an exemplary embodiment of the inventive concept.

FIG. 11 is a block diagram of a memory card system 1100 including a resistive memory device according to an exemplary embodiment of the inventive concept.

Referring to FIG. 11, the memory card system 1100 include a host 1110 (e.g., a host device) and a memory card 1120. The host 1110 includes a host controller 1111 and a host connector 1112. The memory card 1120 includes a card connector 1121, a card controller 1122 (e.g., a control circuit), and a memory device 1123.

The host 1110 may write data in the memory card 1120, or read data stored in the memory card 1120. The host controller 1111 may transmit a command CMD, a clock signal CLK, and data DATA through the host connector 1112 to the memory card 1120.

The card controller 1122 may store the data DATA in the memory device 1123 in synchronization with a clock signal generated by a clock generator included in the card controller 1122, in response to the command CMD received through the card connector 1121. The memory device 1123 may store the data DATA transmitted from the host 1110. The memory device 1123 may be implemented using the embodiments described above in relation to FIGS. 1 to 9C.

The memory device 1123 may be a resistive memory device including memory cells provided at intersections between multiple word lines and multiple bit lines and having a resistance level which varies depending on the state of stored data. The memory device 1123 may perform a first write operation in response to an active command and a write command and perform a second write operation in response to a write active command and the write command. In an embodiment, the first write operation includes a read data evaluation operation for reading data stored in memory cells in a bank active state based on the active command, and a comparison operation for receiving write data and comparing the write data to the read data in a first write mode state based on the write command. In an embodiment, the second write operation includes a pre-active state for receiving a bank address and a row address in response to the write active command, and a second write mode state for receiving bits of the write data in response to the write command. The second write operation does not include the read data evaluation operation and the comparison operation of the first write operation. As such, a time taken for the second write operation may be reduced compared to a time taken for the first write operation. In an embodiment, the memory device 1123 selectively uses the first write operation and the second write operation. In particular, by selectively using the second write operation, a write operation time may be reduced and thus write latency may also be reduced.

In an exemplary embodiment of the inventive concept, the memory controller 410 or the card controller 1122 is configured to output one of i) the activate command ACT and the write command to the resistive memory device (e.g., 420 or 1123) or ii) the write activate command WACT and the write command to the resistive memory device based on a certain condition upon receiving a write request from a host.

In an exemplary embodiment, the condition is whether a number of writes to a given memory cell that is the destination of the write request has exceeded a first threshold. In an exemplary embodiment, the memory controller 410 or the card controller 1122 outputs the write activate command ACT and the write command to the resistive memory device when the number of writes is below the first threshold and outputs the activate command ACT and the write command to the resistive memory device when the number of writes is greater than or equal to the first threshold.

In another exemplary embodiment of the inventive concept, the condition is whether the number of consecutive writes of a same value (e.g., 1, 1, 1) to a given memory cell has exceeded a second threshold. In an exemplary embodiment, the memory controller 410 or the card controller 1122 outputs the write activate command WACT and the write command to the resistive memory device when the number of consecutive writes of a same value is below the first threshold and outputs the activate command ACT and the write command to the resistive memory device when the number of consecutive writes of a same value is greater than or equal to the second threshold.

The memory card 1120 may be implemented as a compact flash card (CFC), a microdrive, an SMC, a multimedia card (MMC), a secure digital card (SDC), a memory stick, a universal serial bus (USB) flash memory drive, or the like.

Figure 12:
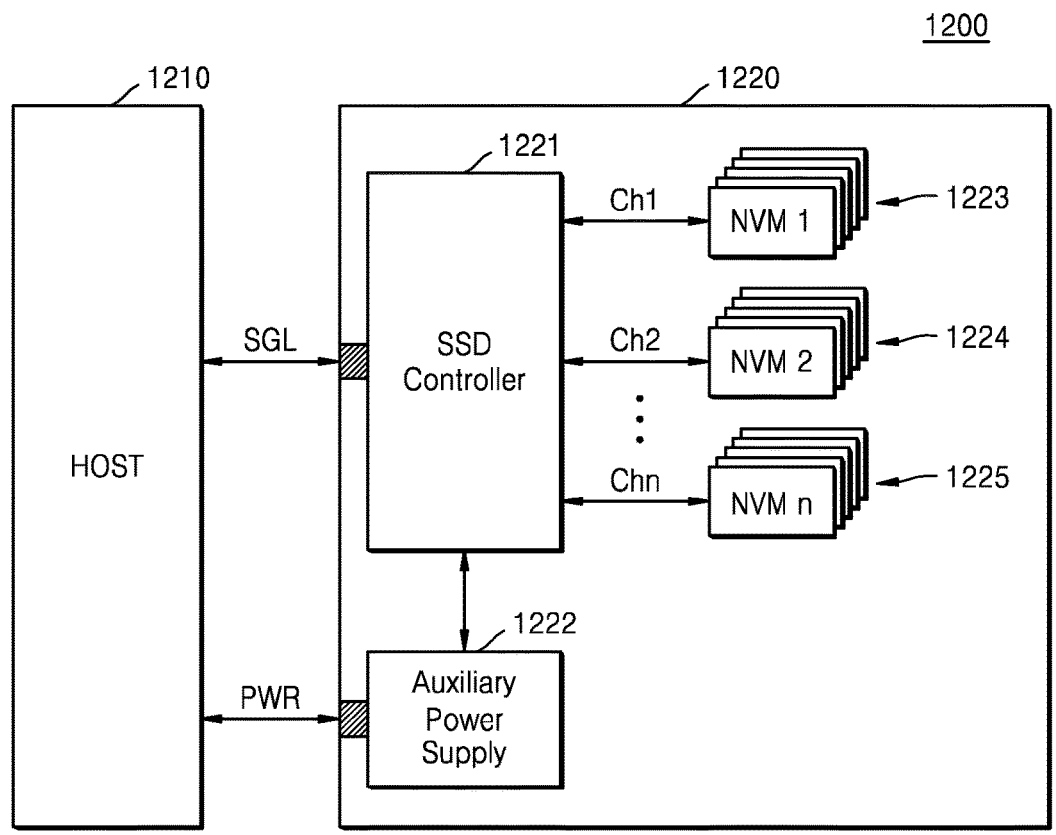
FIG. 12 is a block diagram of a solid-state drive (SSD) system using a resistive memory device according to an exemplary embodiment of the inventive concept.

FIG. 12 is a block diagram of a solid-state drive (SSD) system 1200 using a resistive memory device according to an exemplary embodiment of the inventive concept.

Referring to FIG. 12, the SSD system 1200 may include a host 1210 (e.g., a host device) and an SSD 1220. The SSD 1220 exchanges signals SGL with the host 1210 through a signal connector and receives power PWR through a power connector. The SSD 1220 may include an SSD controller 1221 (e.g., control circuit), an auxiliary power supply 1222, and a plurality of non-volatile memory devices 1223, 1224, and 1225.

The auxiliary power supply 1222 is connected through the power connector to the host 1210. The auxiliary power supply 1222 may be charged with power PWR received from the host 1210. When power supply from the host 1210 is not normal (e.g., lower that a predefined amount), the auxiliary power supply 1222 may provide power to the SSD system 1200. The auxiliary power supply 1222 may be located inside or outside the SSD 1220. For example, the auxiliary power supply 1222 may be located on a main board of the SSD system 1200 and may provide auxiliary power to the SSD 1220.

The non-volatile memory devices 1223 to 1225 are used as storage media of the SSD 1220. The non-volatile memory devices 1223 to 1225 may be connected through a plurality of channels CH1 to CHn to the SSD controller 1221. One or more non-volatile memory devices 1223, 1224, or 1225 may be connected to each of the channels CH1 to CHn.

Each of the non-volatile memory devices 1223 to 1225 may be implemented using the embodiments described above in relation to FIGS. 1 to 9C. Each of the non-volatile memory devices 1223 to 1225 may perform a first write operation in response to an active command and a write command and perform a second write operation in response to a write active command and the write command. In an embodiment, the first write operation includes a read data evaluation operation for reading data stored in memory cells in a bank active state based on the active command, and a comparison operation for receiving write data and comparing the write data to the read data in a first write mode state based on the write command. In an embodiment, the second write operation includes a pre-active state for receiving a bank address and a row address in response to the write active command, and a second write mode state for receiving bits of the write data in response to the write command. The second write operation does not include the read data evaluation operation and the comparison operation of the first write operation. As such, a time taken for the second write operation may be reduced compared to a time taken for the first write operation. In an embodiment, each of the non-volatile memory devices 1223 to 1225 selectively uses the first write operation and the second write operation. In particular, by using the selective second write operation, a write operation time may be reduced and thus write latency may also be reduced. For example, the SSD controller 1221 may selectively use one of the first and write operations based on one or more of the conditions described above.

While the inventive concept has been particularly shown and described with reference to embodiments thereof, it will be understood that various changes in form and details may be made therein without departing from the spirit and scope of the disclosure.

What is claimed is:
1. A method of operating a resistive memory device comprising a memory cell array, the method comprising:
 determining, by the resistive memory device, whether an active command received before a write command is a first type or a second type different from the first type;
 performing, by the resistive memory device, a first operation on the memory cell array when the active com- mand is determined to be the first type in response to the write command, the first operation performing a read data evaluation operation reading read data from the memory cell array and a first write operation writing a part of write data that differs from the read data to the memory cell array; and performing, by the resistive memory device, a second operation on the memory cell array when the active command is determined to be the second type in response to the write command, the second operation performing a second write operation writing the write data to the memory cell array without performing the read data evaluation operation.

2. The method of claim 1, wherein the first operation further comprises a comparison operation for comparing the read data to the write data to determine the part of the write data that differs from the read data, and the second operation comprises an operation of performing the second write operation without performing the comparison operation.

3. The method of claim 1, wherein the resistive memory device transits to a bank active state in response to the active command of the first type and transits to a write mode state in response to the write command during the first operation.

4. The method of claim 3, wherein a row decode operation and the read data evaluation operation are performed in the bank active state, and wherein the row decode operation comprises:
an operation of receiving a bank address and a row address applied to the resistive memory device;
an operation of activating a bank corresponding to the bank address; and
an operation of activating a word line selected in the activated bank by decoding the row address.

5. The method of claim 3, wherein a column decode operation, a write data input operation, and a comparison operation are performed in the write mode state, wherein the column decode operation comprises an operation of receiving and decoding a column address applied to the resistive memory device,
wherein the write data input operation comprises an operation of receiving the write data applied to the resistive memory device, and
wherein the comparison operation comprises an operation of comparing the read data to the write data bit-by-bit.

6. The method of claim 1, wherein the resistive memory device transits to a pre-active state in response to the active command of the second type and transits to a write mode state in response to the write command in the second operation.

7. The method of claim 6, wherein a row decode operation is performed in the pre-active state, and wherein the row decode operation comprises:
an operation of receiving a bank address and a row address applied to the resistive memory device;
an operation of activating a bank corresponding to the bank address; and
an operation of activating a word line selected in the activated bank by decoding the row address.

8. The method of claim 6, wherein a column decode operation and a write data input operation are performed in the write mode state, wherein the column decode operation comprises an operation of receiving and decoding a column address applied to the resistive memory device, and wherein the write data input operation comprises an operation of receiving the write data applied to the resistive memory device.

9. The method of claim 1, wherein the resistive memory device activates a word line of the memory cell array associated with an input address received with the active command, in response to the active command.

10. A resistive memory device comprising:
a memory cell array comprising a memory cell array; and
a control circuit configured to control the resistive memory device to determine whether an active command received before a write command is a first type or a second type different from the first type to perform a first operation on the memory cell array when the active command is determined to be the first type in response to the write command and to perform a second write operation on the memory cell array when the active command is determined to be the second type in response to the write command, the first operation performing a read data evaluation operation reading read data from the memory cell array and a first write operation writing a part of the write data that differs from the read data to the memory cell array, the second operation performing a second write operation writing the write data to the memory cell array without performing the read data evaluation operation.

11. The resistive memory device of claim 10, wherein the first operation further comprises a comparison operation for comparing the read data to the write data to determine the part of the write data that differs from the read data, the second operation performing the second write operation without performing the comparison operation.

12. The resistive memory device of claim 10, wherein the control circuit is further configured to control the resistive memory device to transit to a bank active state in response to the active command of the first type and to transit to a write mode state in response to the write command during the first operation.

13. The resistive memory device of claim 10, wherein the control circuit is further configured to control the resistive memory device to transit to a pre-active state in response to the active command of the second type and to transit to a write mode state in response to the write command during the second operation.

14. The resistive memory device of claim 13, wherein the control circuit is further configured to control the resistive memory device to perform a row decode operation in the pre-active state, and wherein the row decode operation comprises:
an operation of receiving a bank address and a row address applied to the resistive memory device;
an operation of activating a bank corresponding to the bank address; and
an operation of activating a word line selected in the activated bank by decoding the row address.

15. The resistive memory device of claim 13, wherein the control circuit is further configured to control the resistive memory device to perform a column decode operation and a write data input operation in the write mode state, wherein the column decode operation comprises an operation of receiving and decoding a column address applied to the resistive memory device, and wherein the write data input operation comprises an operation of receiving write data applied to the resistive memory device.

16. The resistive memory device of claim 10, wherein the control circuit activates a word line of the memory cell array associated with an input address received with the active command, in response to the active command.

17. A memory system comprising:
- a resistive memory device comprising a memory cell array; and
- a memory controller configured to control operation of the resistive memory device,
- wherein the resistive memory device further comprises:
- a read data latch configured to latch data read from the memory cell array;
- a write data latch configured to latch write data to be written in the memory cell array; and
- a control circuit configured to control the resistive memory device to perform a first write operation with respect to a word line of the memory cell array in response to receiving an active command of a first type and a write command from the memory controller, and to perform a second write operation with respect to the word line of the memory cell array in response to receiving the active command of a second type different from the first type and the write command from the memory controller, and
- wherein the first write operation is performed by comparing bits of the read data to bits of the write data to determine different bits and writing the different data bits to the memory cell array, and the second write operation is performed by writing all bits of the write data to the one memory cell array,
- wherein the control circuit activates the word line in response to the active command.

18. The memory system of claim 17, wherein the control circuit is further configured to control the resistive memory device to transit to a bank active state for receiving a bank address and a row address and latching the read data, in response to the active command of the first type and to transit to a write mode state for receiving the bits of the write data and comparing the bits of the read data to the bits of the write data, in response to the write command, during the first write operation.

19. The memory system of claim 17, wherein the control circuit is further configured to control the resistive memory device to transit to a pre-active state for receiving a bank address and a row address, in response to the write active command of the second type and to transit to a write mode state for receiving the bits of the write data, in response to the write command, during the second write operation.

20. The memory system of claim 17, wherein the comparing is performed using the read data stored in the read data latch and the write data stored in the write data latch.

* * * * *